(12) United States Patent
Tonomura

(10) Patent No.: US 8,094,480 B2
(45) Date of Patent: Jan. 10, 2012

(54) SEMICONDUCTOR DEVICE

(75) Inventor: Yasuko Tonomura, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 48 days.

(21) Appl. No.: 12/453,988

(22) Filed: May 28, 2009

(65) Prior Publication Data

US 2009/0296452 A1 Dec. 3, 2009

(30) Foreign Application Priority Data

May 30, 2008 (JP) .................................. 2008-142098

(51) Int. Cl.
*G11C 11/00* (2006.01)
(52) U.S. Cl. ........................................ 365/148; 365/163
(58) Field of Classification Search .................. 365/148, 365/163

See application file for complete search history.

(56) References Cited

U.S. PATENT DOCUMENTS

| 7,006,371 | B2 * | 2/2006 | Matsuoka ..................... 365/148 |
| 7,075,813 | B2 * | 7/2006 | Moriyama et al. ............ 365/148 |
| 7,646,632 | B2 * | 1/2010 | Philipp et al. ................. 365/163 |
| 7,701,750 | B2 * | 4/2010 | Shih et al. ..................... 365/148 |

FOREIGN PATENT DOCUMENTS

| JP | 2005-18916 | 1/2005 |
| JP | 2005-50424 | 2/2005 |

* cited by examiner

*Primary Examiner* — Huan Hoang
(74) *Attorney, Agent, or Firm* — McGinn IP Law Group, PLLC

(57) ABSTRACT

A semiconductor device has a plurality of memory cells including memory elements to store information by varying resistance values of the memory elements. The semiconductor device further has a reference system circuit enables measurement of distribution of the resistance values for the plurality of memory cells.

7 Claims, 10 Drawing Sheets

| TREF1(25k) | TREF2(50k) | TREF3(60k) | TREF4(75k) | TREF5(100k) | Rref(kΩ) |
|---|---|---|---|---|---|
| 0 | 0 | 0 | 0 | 0 | |
| | | | | 1 | 100.0 |
| | | | 1 | 0 | 75.0 |
| | | | | 1 | 42.9 |
| | | 1 | 0 | 0 | 60.0 |
| | | | | 1 | 37.5 |
| | | | 1 | 0 | 33.3 |
| | | | | 1 | 25.0 |
| | 1 | 0 | 0 | 0 | 50.0 |
| | | | | 1 | 33.3 |
| | | | 1 | 0 | 30.0 |
| | | | | 1 | 23.1 |
| | | 1 | 0 | 0 | 27.3 |
| | | | | 1 | 21.4 |
| | | | 1 | 0 | 20.0 |
| | | | | 1 | 16.7 |
| 1 | 0 | 0 | 0 | 0 | 25.0 |
| | | | | 1 | 20.0 |
| | | | 1 | 0 | 18.8 |
| | | | | 1 | 15.8 |
| | | 1 | 0 | 0 | 17.6 |
| | | | | 1 | 15.0 |
| | | | 1 | 0 | 14.3 |
| | | | | 1 | 12.5 |
| | 1 | 0 | 0 | 0 | 16.7 |
| | | | | 1 | 14.3 |
| | | | 1 | 0 | 13.6 |
| | | | | 1 | 12.0 |
| | | 1 | 0 | 0 | 13.0 |
| | | | | 1 | 11.5 |
| | | | 1 | 0 | 11.1 |
| | | | | 1 | 10.0 |

FIG. 4

SEMICONDUCTOR DEVICE

This application is based upon and claims the benefit of priority from Japanese patent application No. 2008-142098, filed on May 30, 2008, the disclosure of which is incorporated herein in its entirety by reference.

BACKGROUND OF THE INVENTION

1. Field of the Invention

This invention relates to a semiconductor device and, in particular, to a semiconductor device having resistance variable memory cells.

2. Description of the Related Art

A resistance variable memory cell includes a memory element for storing information as variation in resistance. A voltage at a predetermined level is applied to a memory element serially connected to a load with a predetermined resistance, whereby an output voltage corresponding to the resistance of the memory element can be obtained at a node between the memory element and the load. Information written in the memory element is read out by comparing this output voltage with a reference voltage.

The reference voltage is obtained by applying a voltage at a predetermined level to a reference resistance element serially connected to a load having a predetermined resistance.

In the case of a semiconductor device having a single reference resistance element for a plurality of memory cells, it may be impossible to read information from more than an allowable number of memory cells depending on characteristics of the memory cells. Techniques therefore have been proposed to make the resistance value of the reference resistance variable so that the resistance of the reference resistance element is set according to characteristics of a plurality of memory cells. This type of technique is described for example in Japanese Laid-Open Patent Publication No. 2005-18916 (Patent Document 1) and Japanese Laid-Open Patent Publication No. 2005-50424 (Patent Document 2).

Patent Document 1 describes a technique in which characteristics of memory cells and a reference cell are tested, and information is written in the reference cell based on the test result to set the resistance value of the reference resistance. However, I have now discovered that Patent Document 1 does not describe at all how to set a reference potential when there are a large number of memory cells and there is resistance distribution. Consequently, the semiconductor device described in Patent Document 1 has a drawback that it is impossible to set the resistance value of the reference resistance more appropriately when there is resistance distribution among a plurality of memory cells.

As for a semiconductor device described in Patent Document 2, a lower limit of resistance distribution in the high-resistance state of all the memory cells and a higher limit of the resistance distribution in the low-resistance state are obtained, and a mean value of these lower and higher limits is set as a resistance value of the reference resistance. Consequently, this semiconductor device also has a drawback, similarly to the one described in Patent Document 1, that it is impossible to set the resistance value of the reference resistance more appropriately according to the resistance distribution.

SUMMARY

The present invention seeks to solve one or more of the above problems, or to improve upon those problems at least in part.

In one embodiment, there is provided a semiconductor device having a plurality of memory cells and designed to store information by varying resistance values of memory elements included in the memory cells. The semiconductor device is characterized by further including a reference system circuit enabling measurement of distribution of the resistance values for the plurality of memory cells.

In another embodiment, there is provided a reference level determination method for determining a resistance value of a reference resistance for a semiconductor device having a plurality of memory cells and designed to store information by varying the resistance values of memory elements included in the memory cells. This method is characterized in that distribution of the resistance values of the plurality of memory cells is measured, and the resistance value of the reference resistance is determined based on the degree of distribution thus obtained.

This invention makes it possible to measure the resistance distribution of a plurality of memory cells, and thus to set the reference level more appropriately according to the resistance distribution obtained by the measurement.

BRIEF DESCRIPTION OF THE DRAWINGS

The above features and advantages of the present invention will be more apparent from the following description of certain preferred embodiments taken in conjunction with the accompanying drawings, in which:

FIG. 4 is a diagram showing relationship between ON/OFF states of resistance element selector switches included in the resistance selection circuit of FIG. 3 and obtained combined resistance;

DETAILED DESCRIPTION OF THE PREFERRED EMBODIMENTS

Before describing of the present invention, the related art will be explained in detail with reference to FIG. 1 in order to facilitate the understanding of the present invention.

Figure 1:
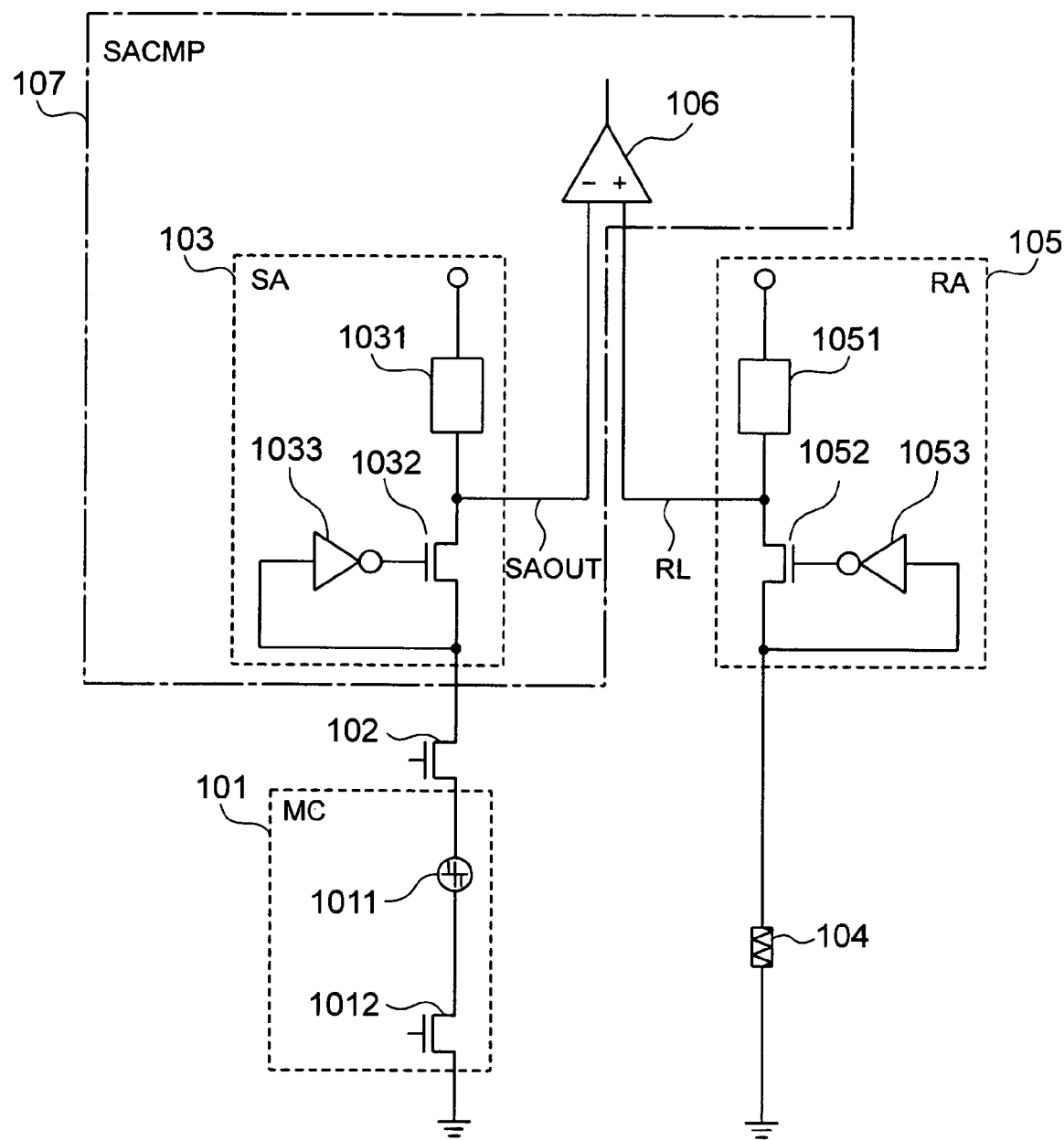
FIG. 1 is a configuration diagram showing a principal part of a semiconductor device according to a related art.

FIG. 1 shows a configuration example of a principal part of a semiconductor device including a resistance variable memory cell according to a related art.

The semiconductor device of FIG. 1 has a memory cell (MC) 101, a Y switch (YSW) 102 connected to the memory cell 101, a sense amplifier (SA) 103 connected to the Y switch 102, a referential resistance element or cell (hereafter, simply referred to as the referential resistance element) (RREF) 104, a reference amplifier (RA) 105 connected to the referential resistance element 104, and a comparator 106 connected to the sense amplifier 103 and the reference amplifier 105.

The memory cell 101 includes a memory element (PC) 1011 having a resistance which is variable according to a phase change or the like, and a select transistor switch 1012. The sense amplifier 103 includes a load 1031, a transistor 1032 and an inverter 1033, and the reference amplifier 105 includes a load 1051, a transistor 1052 and an inverter 1053.

The sense amplifier 103 and the comparator 106 together form a comparison read-out circuit (SACMP) 107.

In this semiconductor device, an electric current flows through the memory element 1011 according to its resistance when the Y switch 102 and the select transistor switch 1012 are turned ON. As a result, in the sense amplifier 103, a potential according to the resistance of the memory element 1011 appears at the node between the load 1031 and the transistor 1032. The sense amplifier 103 output this potential to one of input terminals of the comparator 106 as a sense amplifier output SAOUT.

On the other hand, an electric current flows also through the referential resistance element 104 according to its resistance. The reference amplifier 105 outputs the potential appearing at the node between the load 1051 and the transistor 1052 according to the current flowing through the referential resistance element 104 to the other input terminal of the comparator 106 as a reference level RL.

The comparator 106 compares the output SAOUT from the sense amplifier 103 with a reference level RL from the reference amplifier 105 and outputs a result of the comparison.

The resistance value of the referential resistance element 104 can be set to an intermediate value between the resistance value when the memory element 1011 is in the high-resistance state and the resistance value when the memory element 1011 is in the low-resistance state, so that the reference level RL can be set lower than the sense amplifier output SAOUT when the memory element 1011 is in the high-resistance state, and higher than the sense amplifier output SAOUT when the memory element 1011 is in the low-resistance state. As a result, the output of the comparator 106 represents information written in the memory element 1011 (logic "0" (high resistance) or "1" (low resistance)). In this manner, the semiconductor device of FIG. 1 can read out the one-bit information written in the memory cell 101.

Although only one memory cell 101 is shown in FIG. 1, an actual semiconductor (memory) device has a large number of memory cells. These memory cells do not necessarily have identical characteristics due to manufacturing variations or the like. This means that an actual semiconductor device may have a certain degree of distribution in terms of resistance values of its memory cells (resistance distribution). Moreover, this resistance distribution may be different in each chip.

In a semiconductor device designed to provide a single reference resistance for a plurality of memory cells, if a resistance value of the reference resistance is preset to a predetermined value (fixed value), there may be more memory cells than an allowable number that are unreadable depending on their characteristics.

Exemplary preferred embodiments of this invention will be described with reference to FIGS. 2 to 10.

Figure 2:
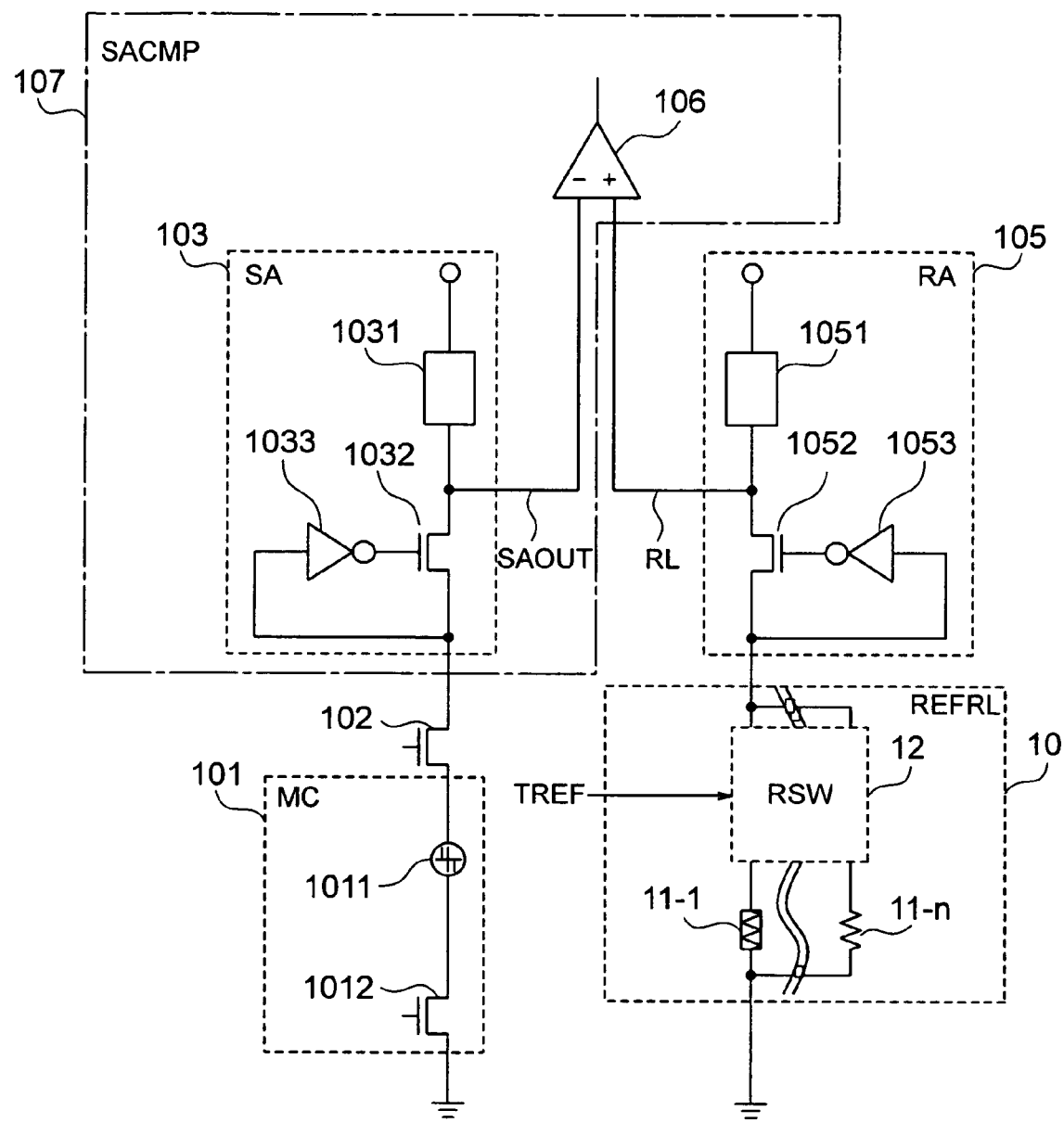
FIG. 2 is a configuration diagram showing a principal part of a semiconductor device according to a first embodiment of this invention.

FIG. 2 shows a configuration of a principal part of a semiconductor device according to a first embodiment of this invention. In FIG. 2, like components as those of the related semiconductor device shown in FIG. 1 are assigned with the same reference numerals, and description thereof will be omitted. It should be understood that although only one memory cell 101 is shown in FIG. 2, a plurality of memory cells are connected in common (in a hierarchical manner) to the sense amplifier 103 via the respective Y switches.

The semiconductor device shown in FIG. 2 has a reference system circuit (REFRL) 10 in place of the conventional referential resistance element 104.

The reference system circuit 10 has n (n is a natural number) referential resistances (RREF1 to RREFn) 11-1 to 11-$n$ one end of each of which is grounded, and a resistance selection circuit (RSW) 12 connected to the other ends of these referential resistances. The resistance selection circuit 12 selectively connects at least one of the n reference resistances 11-1 to 11-$n$ to the reference amplifier 105 according to a referential resistance switching signal TREF supplied externally. The resistance values of the referential resistance elements 11-1 to 11-$n$ are different from one another, for example.

Figure 3:
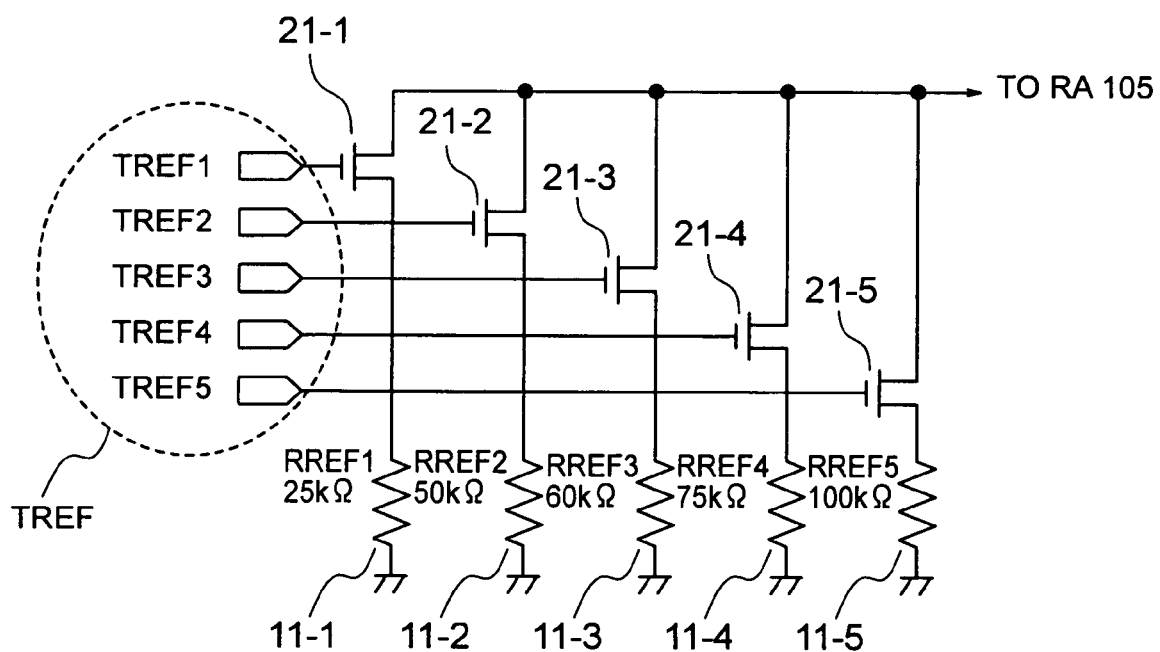
FIG. 3 is a circuit diagram showing a configuration example of a resistance selection circuit included in the semiconductor device of FIG. 2.

FIG. 3 shows in detail a configuration example of the reference system circuit 10. This example shows a case in which n is five, and the resistance values of the referential resistance elements 11-1 to 11-5 (RREF1 to RREF5) are 25 kΩ, 50 kΩ, 60 kΩ, 75 kΩ and 100 kΩ, respectively. These reference resistance elements 11-1 to 11-5 are respectively connected to resistance element selector switches 21-1 to 21-5 of MOS transistors or the like. A plurality of serially connected bodies are composed of reference resistance elements 11-1 to 11-5 and the resistance element selector switches 21-1 to 21-5, and these serially connected bodies are connected in parallel to each other. The turning ON and OFF of the resistance element selector switches 21-1 to 21-5 are controlled by referential resistance switching signals TREF1 to TREF5 which are control signals supplied externally, whereby the reference resistance elements 11-1 to 11-5 are selectively connected to the reference amplifier 105.

According to the configuration shown in FIG. 3, the resistance of the reference system circuit 10 can be varied in a wide range from 10.0 kΩ to 100.0 kΩ as shown in FIG. 4, by changing the number and combination of the reference resistance elements 11-1 to 11-5 electrically connected to the reference amplifier 105. In FIG. 4, when the referential resistance switching signals TREF1 to TREF5 have a logical level "1", the reference resistance elements 11-1 to 11-5 are electrically connected to the reference amplifier 105, respectively.

The number and resistance values of the reference resistance elements 11-1 to 11-$n$ are determined such that the minimum possible resistance value that the reference system circuit 10 can provide is smaller than the value that the memory element 1011 can assume in its low-resistance state, and the maximum possible resistance value that the reference system circuit 10 can provide is greater than the value that the memory element 1011 can assume in its high-resistance state. In this manner, the number and resistance values of the reference resistance elements 11-1 to 11-$n$ can be predetermined so that the distribution of resistance values (resistance distribution) in all the memory cells in their low-resistance state and high-resistance state can be measured.

The resistance distribution can be measured by performing a plurality of read operations on each of the memory cells 101 while changing the resistance value of the reference system circuit 10. For example, it is assumed that when a read operation is performed on a memory cell 101 with the resistance value being set to ra Ω (ra is a positive number) by a combination of the reference resistance elements 11-1 to 11-$n$, the logic "0" (high resistance) is output from the comparator 106. When a read operation is performed on the same memory cell 101 with the resistance value being set to ra+xΩ (x is a positive number) by a combination of the reference resistance elements 11-1 to 11-n, the logic "1" (low resistance) is output from the comparator 106. Then, the resistance value rb of that memory cell is determined to be ra<rb<ra+X. Thus, the resistance distribution can be obtained by finding, for all the memory cells 101, the resistance values when the logic "1" is written and when the logic "0" is written. The resistance distribution is useful for material evaluation or defective analysis.

Next, referring to FIG. 5, a reference level decoder RLDEC for outputting referential resistance switching signals TREF-1 to TREF-n to the reference system circuit 10 will be described.

Figure 5:
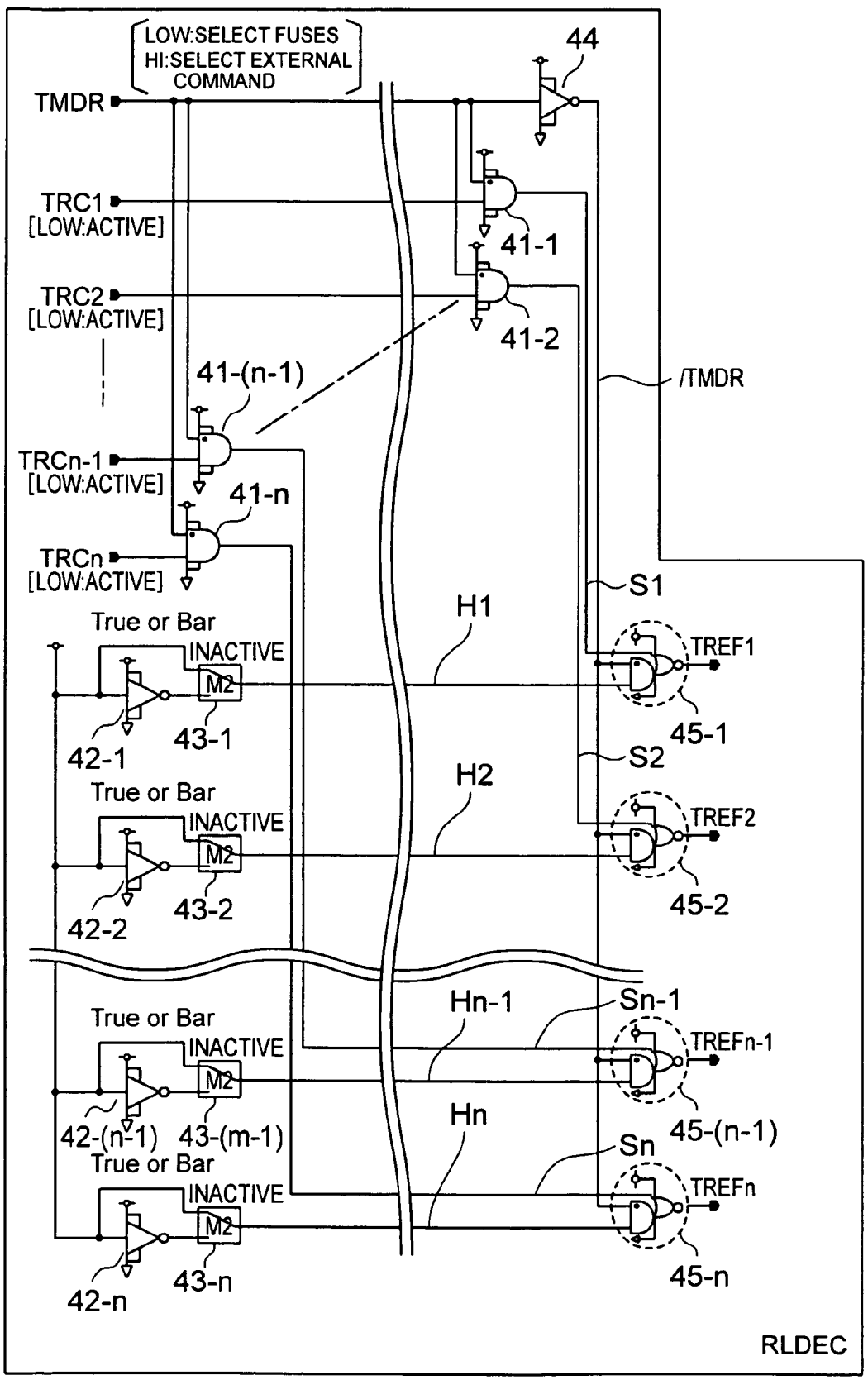
FIG. 5 is a circuit diagram showing a configuration example of a reference level decoder for supplying a referential resistance switching signal to a reference system circuit included in the semiconductor device of FIG. 2.

The reference level decoder shown in FIG. 5 includes a circuit portion for generating first preliminary signals S1 to Sn in response to an external command supplied to external command input terminals TRC1 to TRCn from outside of a chip having the reference level decoder, a memory cell array and so on mounted thereon, a circuit portion for generating second preliminary signals H1 to Hn according to setting states of fuses, and a circuit portion for outputting inverted signals of the first preliminary signals S1 to Sn or second preliminary signals H1 to Hn as referential resistance switching signals TREF1 to TREFn in accordance with a selection signal TDMR.

Specifically, this reference level decoder has AND circuits 41-1 to 41-n which obtain logical products between the selection signal TDMR and the respective external commands input to the external command input terminals TRC1 to TRCn and output the logical products as first preliminary signals S1 to Sn, fuses 43-1 to 43-n combined with inverters 42-1 to 42-n to output second preliminary signals H1 to Hn in accordance with the states (i.e. connection or disconnection) thereof, an inverter 44 for outputting an inverted signal /TMDR obtained by logically inverting the selection signal TDMR, and composite logic circuits 45-1 to 45-n which logically invert the first preliminary signals S1 to Sn or second preliminary signals H1 to Hn in accordance with the inverted signal/TMDR and output the inverted signals as referential resistance switching signals TREF1 to TREFn. The composite logic circuits 45-1 to 45-n each have an AND circuit for obtaining a logical product between the inverted signal/TMDR and its corresponding one of the second preliminary signals H1 to Hn, and a NOR circuit for obtaining a negative OR between the output of the AND circuit and its corresponding one of the first preliminary signals S1 to Sn and outputting the negative OR as referential resistance switching signals TREF1 to TREFn.

When the selection signal TMDR is "HI", the AND circuits 41-1 to 41-n output first preliminary signals S1 to Sn in accordance with an external command input to the external command input terminals TRC1 to TRCn. Since the inverted signal /TMDR of the selection signal TMDR is "LOW" at this time, the second preliminary signals H1 to Hn are blocked by the AND circuits in the composite logic circuits 45-1 to 45-n. As a result, the composite logic circuits 45-1 to 45-n output signals obtained by logically inverting the first preliminary signals H1 to Hn as referential resistance switching signals TREF1 to TREFn.

On the other hand, when the selection signal TMDR is "LOW", the first preliminary signals S1 to Sn from the AND circuits 41-1 to 41-n are "LOW" regardless of the external command input to the external command input terminals TRC1 to TRCn. Since the inverted signal/TMDR of the selection signal TMDR is "HI" at this time, the composite logic circuits 45-1 to 45-n output signals obtained by logically inverting the second preliminary signals H1 to Hn as referential resistance switching signals TREF1 to TREFn.

As described above, the use of the reference level decoder shown in FIG. 5 makes it possible to selectively combine the referential resistance elements 11-1 to 11-n according to an external command when the selection signal TMDR is "HI". When the selection signal TMDR is "LOW", the referential resistance elements 11-1 to 11-n can be selectively combined according to the setting of the fuses 43-1 to 43-n. This enables the semiconductor device shown in FIG. 2 to measure the resistance distribution in all the memory cells firstly in the test mode, and then to set a reference level in the normal mode appropriately according to the resistance distribution by disconnecting the fuses in accordance with a measurement result of the resistance distribution.

When the reference level decoder of FIG. 5 is used, even after selective disconnection of the fuses, the selection signal TMDR can be set "HI" so that the reference level can be changed in accordance with an external command input through the external command input terminals TRC1 to TRCn provided in the chip.

Next, referring to FIGS. 6 and 7, a method of determining a reference level will be described.

As described above, the measurement of resistance distribution is performed on when the logic "1" is written in the memory cells and on when the logic "0" is written. The measurement is conducted by setting the selection signal TMDR "HI", while changing the combined resistance of the referential resistance elements 11-1 to 11-n by means of an external command input to the external command input terminals TRC1 to TRCn.

Figure 6:
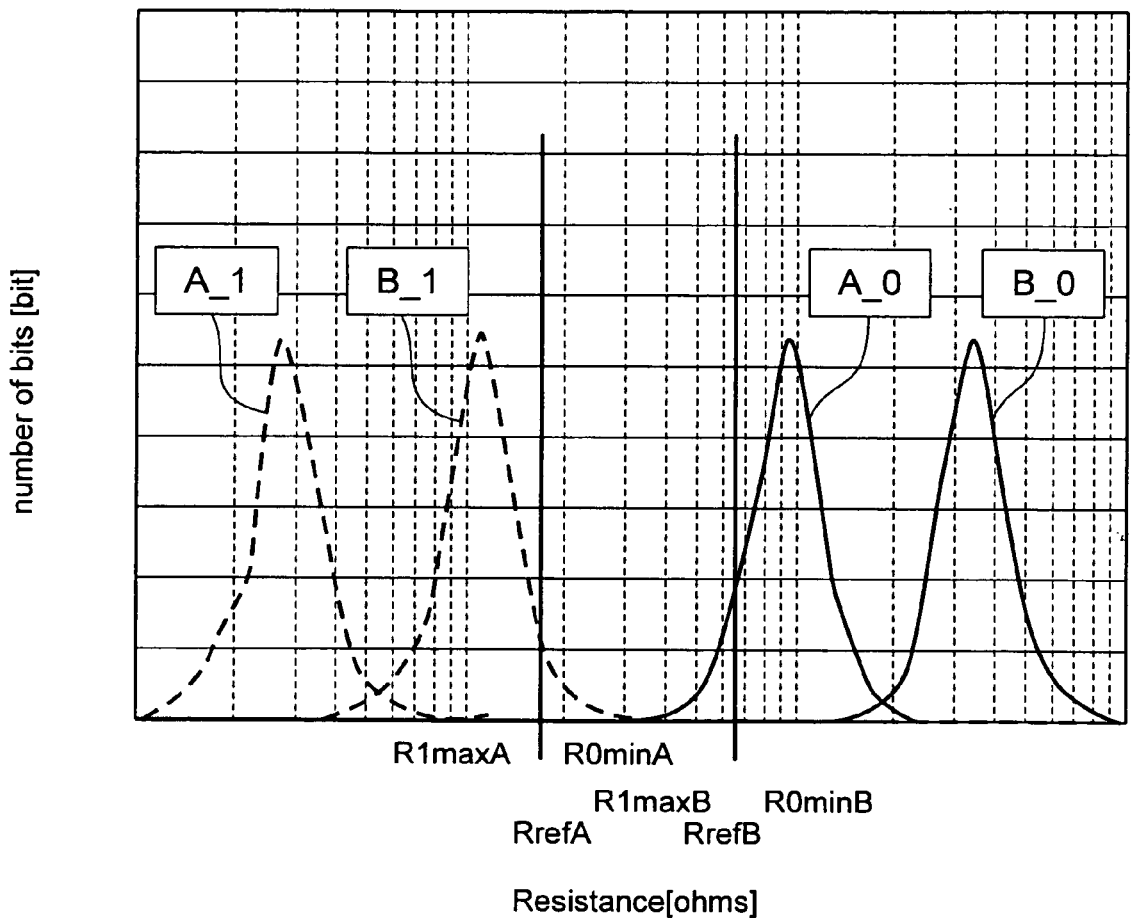
FIG. 6 is graphs showing an example of resistance distribution.

FIG. 6 shows graphs representing measurement results of resistance distribution of two chips A and B. While the graph of the chip A and the graph of the chip B have substantially identical shapes, the graph of the chip A is located on the low-resistance side and the graph of the chip B is located on the high-resistance side. Therefore, the reference resistance of the chip A is set to the low-resistance side and the reference resistance of the chip B is set to the high-resistance side.

Both the distribution graphs of the chip A and chip B have substantially identical shapes between in the low-resistance state (when "1" is written) and in the high-resistance state (when "0" is written), and are particularly identical in terms of the peak height of degree of distribution. In this case, the reference resistance Rref (i.e. RrefA or RrefB) may be determined to be an intermediate value between the resistance value in the low-resistance state and the resistance value in the high-resistance state. For example, the reference resistance Rref is set to an intermediate value between the maximum resistance R1max of the distribution in the low-resistance state and the minimum resistance R0min of the distribution in the high-resistance state. This means that Rref=(R1max+R0min)/2.

According to this embodiment of the invention as described above, an appropriate reference resistance can be set even if the resistance distribution differs for each chip. This makes it possible to prevent production of defective chips caused by deviation of the resistance distribution.

Figure 7:
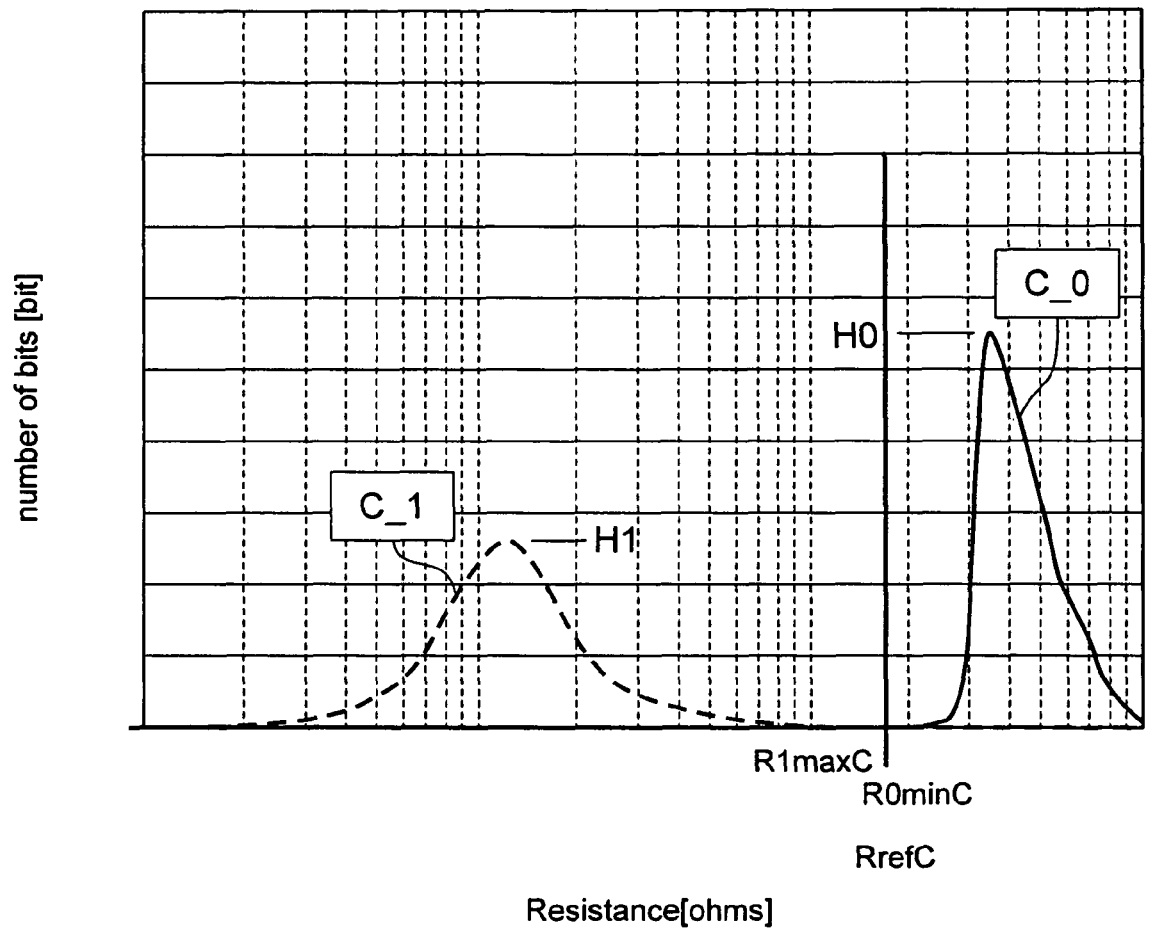
FIG. 7 is graphs showing another example of resistance distribution.

FIG. 7 shows graphs representing measurement results of a chip C. The shapes of the distribution graphs of this chip C are different between in the low-resistance state and in the high-resistance state. In this case, the reference resistance Rref (i.e. RrefC) is determined according to the degree of distribution (peak height) of the distribution graph. Specifically, the reference resistance Rref is determined to be a value biased to either one of the degrees of distribution having a higher distribution peak from the intermediate value between the resistance values in the low-resistance state and the high-resistance state. For example, when the ratio between a distribution peak height H1 in the low-resistance state and a distribution peak height H0 in the high-resistance state is H1:H0=ha:hb, the reference resistance Rref is set such that Rref=R1max+(R0min−R0max)·hb/(ha+hb), wherein R1max indicates a maximum resistance value in the low-resistance state distribution and R0min indicates a minimum resistance value in the high-resistance state distribution.

In this manner, the reference resistance can be set to a value closer to the higher distribution peak than the intermediate value between the maximum resistance value R1max in the low-resistance state distribution and the minimum resistance value R0min in the high-resistance state distribution. This makes it possible to set the reference resistance to an appropriate value even if the variation in resistance is great among the memory cells, and thus to prevent production of defective cells.

Although FIG. 2 shows an example in which a single reference amplifier (RA) 105 and a single reference system circuit (REFRL) 10 are provided for a single comparison read-out circuit (SACMP) 107, a single reference amplifier and a single reference system circuit may be provided for a plurality of comparison read-out circuits. One such example is shown in FIGS. 8 and 9.

Figure 8:
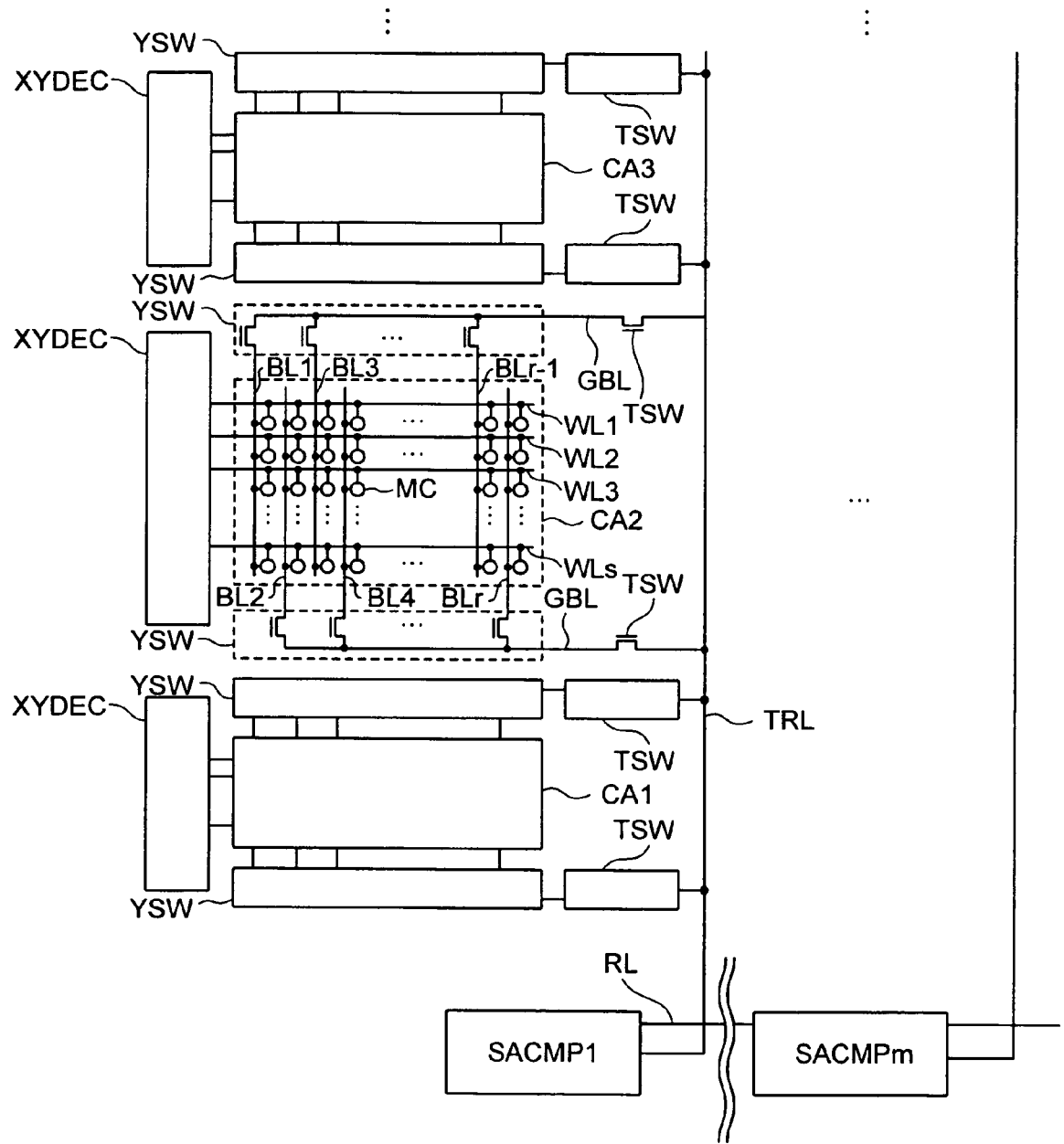
FIG. 8 is a diagram showing a configuration example of a semiconductor device having a plurality of comparison readout circuits.

In a semiconductor device shown in FIG. 8, a plurality of memory cell arrays CA1, CA2, CA3, . . . are connected to one of the comparison read-out circuits (SACMP1) via Y switches YSW, transfer switches TSW, and a transfer line TRL to form one constituent unit. A plurality of such constituent units (m units in this example) are provided in the semiconductor device. The plurality of comparison read-out circuits (SACMP1 to SACMPm) use in common a single reference amplifier and a single reference system circuit. Taking power-supply noise or the like into consideration, the number m can be set to a number corresponding to a half of a bank.

Figure 9:
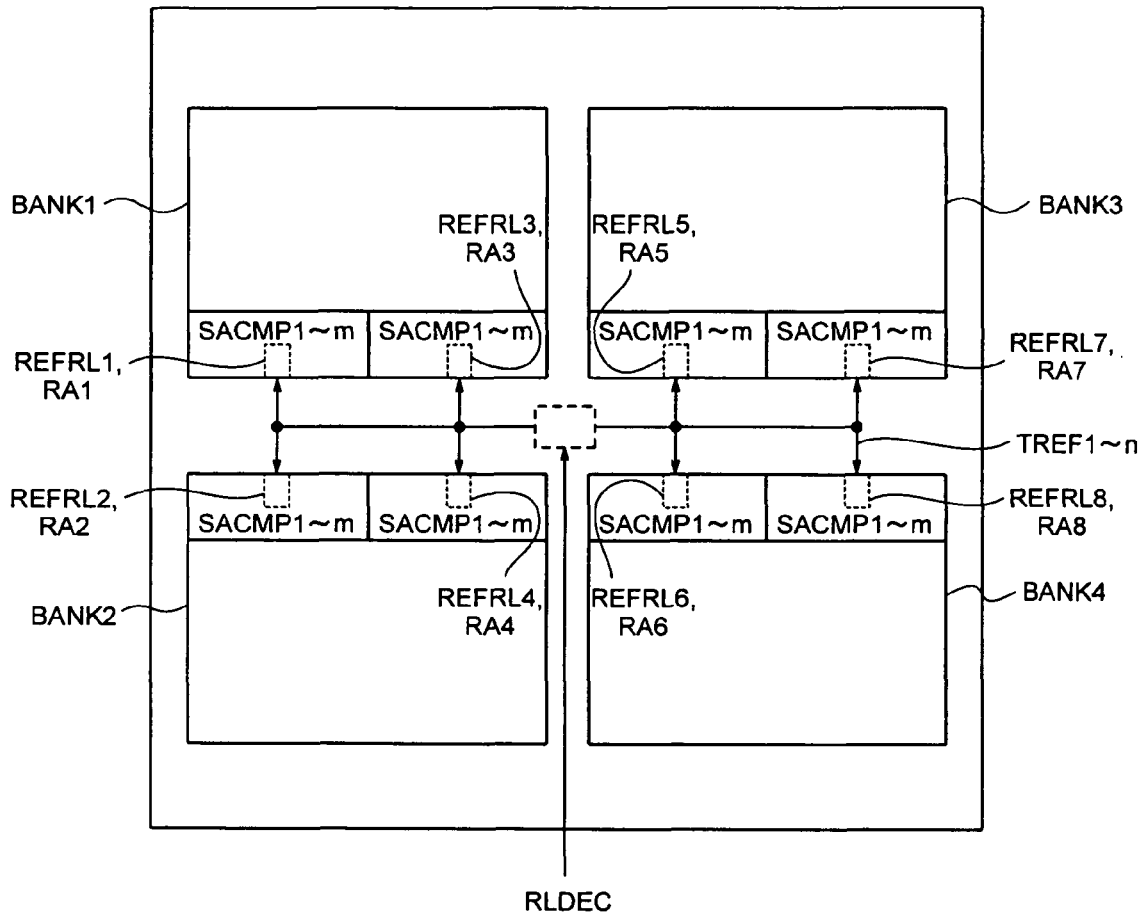
FIG. 9 is a diagram showing a configuration example of a semiconductor device having a plurality of comparison readout circuits and one reference level decoder.

A semiconductor device shown in FIG. 9 has one reference amplifier RA1 to RA8 and one reference system circuit REFRL1 to REFRAL8 in each half bank. These reference system circuits REFRL1 to REFRAL8 can be provided with only one reference decoder RLDEC. In this case, the reference decoder RLDEC is arranged at a center of the chip, and referential resistance switching signals TREF1 to TREFn from the reference decoder RLDEC are supplied in common to all the reference system circuits REFRL1 to REFRAL8.

Figure 10:
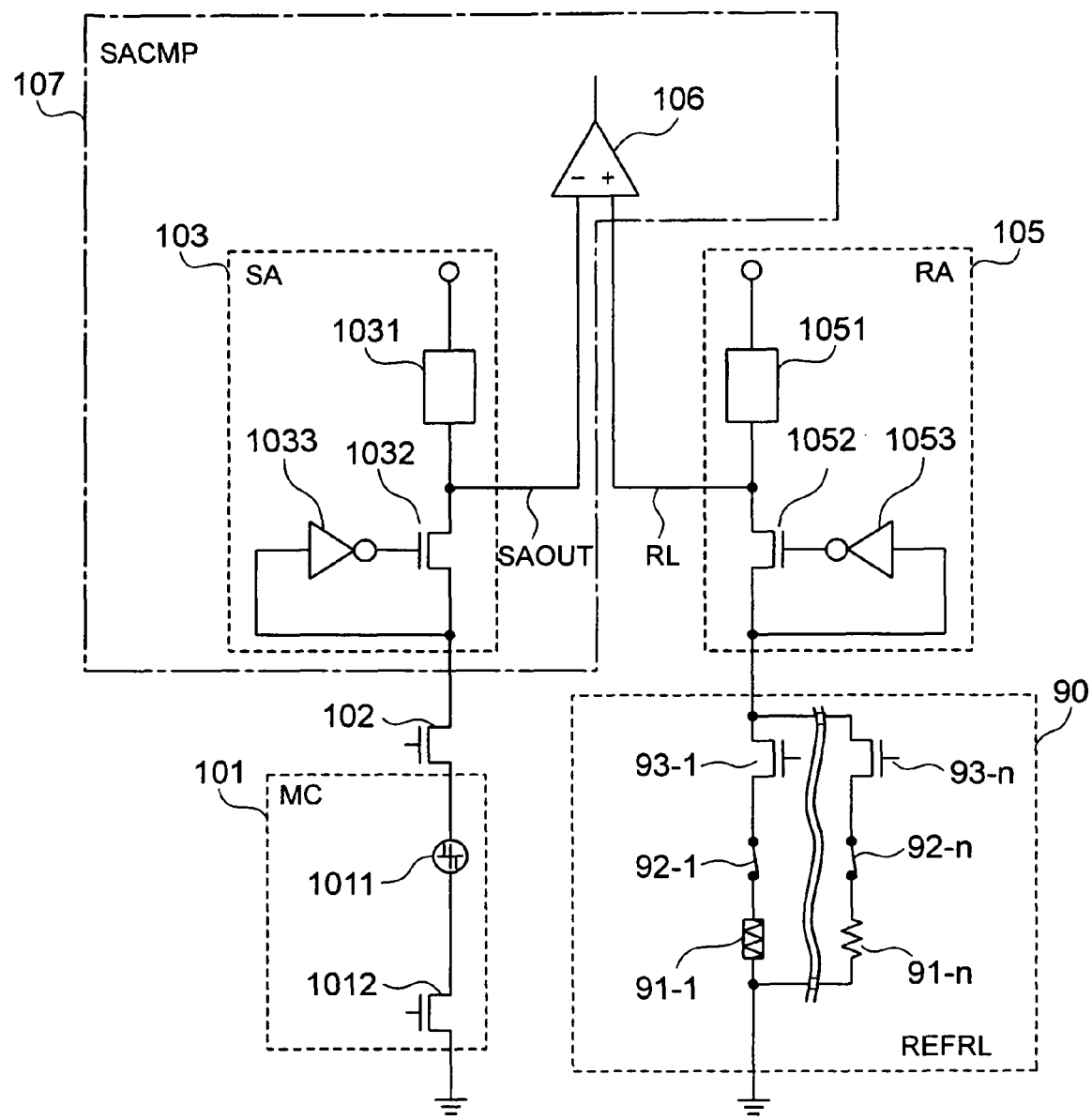
FIG. 10 is a configuration diagram showing a principal part of a semiconductor device according to a second embodiment of this invention.

Next, a second embodiment of this invention will be described with reference to FIG. 10.

Whereas fuses are provided in the reference level decoder RLDEC in the first embodiment, fuses are provided within a reference system circuit 90 in this second embodiment. This eliminates the need of the reference level decoder RLDEC in the second embodiment.

Describing in more detail, the reference system circuit 90 has a plurality of referential resistance elements 91-1 to 91-n (n referential resistance elements in this example) one ends of which are grounded. The resistance values of the referential resistance elements 91-1 to 91-n are different from one another, for example. The other ends of the referential resistance elements 91-1 to 91-n are connected to one ends of fuses 92-1 to 92-n, respectively. The other ends of the fuses 92-1 to 92-n are connected to one ends of reference resistance selector switches 93-1 to 93-n, respectively. The other ends of the reference resistance selector switches 93-1 to 93-n are connected in common to the reference amplifier 105.

According to the second embodiment as well, the reference resistance selector switches 93-1 to 93-n can be selectively turned ON or OFF so that an appropriate combined resistance can be obtained by combining the referential resistance elements 91-1 to 91-n as necessary.

The resistance distribution is measured for all the memory cells in the test mode, and the fuses are selectively disconnected so as to obtain an optimum reference resistance based on the measurement results.

According to this second embodiment, the resistances of the plurality of reference system circuits provided in the same chip (see FIG. 9) can be different from each other.

Although this invention has been described above in conjunction with several preferred embodiments thereof, it is apparent that the present invention is not limited to the foregoing embodiments but may be modified and changed in various other manners without departing from the scope and spirit of the invention.

What is claimed is:

1. A semiconductor device comprising:
a plurality of memory cells including memory elements to store information by varying resistance values of the memory elements; and
a reference system circuit enabling a measurement of distribution of the resistance values for the plurality of memory cells,
wherein the reference system circuit comprises a resistance selection circuit in which a resistance value of a reference resistance to be compared with the resistance values of the memory elements is variable from a first resistance value lower than a minimum resistance value that the memory elements assume up to a second resistance value higher than a maximum resistance value that the memory elements assume, and
wherein the resistance selection circuit comprises switches that are serially connected to a plurality of resistance elements having mutually different resistances via respective fuses to form serially-connected bodies, and these serially-connected bodies are connected in parallel, so that before disconnection of the fuses, the reference resistance is formed by selectively combining the plurality of resistance elements according to an externally input control signal, and after selective disconnection of the fuses, the reference resistance is formed by selectively combining the plurality of resistance elements according to the fuse state.

2. The semiconductor device of claim 1, further comprising:
a sense amplifier converting the resistance value of the memory element into a first potential;
a reference amplifier converting the resistance value of the reference resistance into a second potential; and
a comparator comparing the first potential with the second potential.

3. The semiconductor device of claim 2, further comprising a plurality of the sense amplifiers and a plurality of the comparators, wherein the second potential is supplied in common to the comparators from the reference amplifier.

4. A reference level determination method comprising:
providing a semiconductor device comprising a reference system circuit including a plurality of reference resistances, and a resistance selection circuit connected to the plurality of reference resistances;

varying a resistance value of the reference system circuit to measure a distribution of resistance values of memory elements included in a plurality of memory cells of the semiconductor device; and determining a resistance value of a reference resistance based on a degree of the distribution;

wherein when in the plurality of memory cells, there is a disparity between the degree of distribution in a low-resistance state and the degree of distribution in a high-resistance state, the resistance value of the reference resistance is determined to be a value biased to either one of the degrees of distribution having a higher distribution peak from the intermediate value between the resistance values in the low-resistance state and the resistance value in the high-resistance state.

5. The reference level determination method of claim 4, wherein the resistance value of the reference resistance is determined such that $Rref = R1\,max + (R0min - R0max) \cdot hb/(ha+hb)$, where Rref is the reference resistance, $R1\,max$ is a maximum resistance of the distribution in the low-resistance state, R0min is a minimum resistance of the distribution in the high-resistance state, R0max is a maximum resistance of the distribution in the high-resistance state, and ha:hb=H1:H0, where H1 is a distribution peak height in the low-resistance state and H0 is a distribution peak height in the high-resistance state.

6. A semiconductor device comprising:

a plurality of memory cells including memory elements to store information by varying resistance values of the memory elements;

a reference system circuit including a variable resistance value to be output for a reference of the memory cells; and first and second chips each of which includes the plurality of memory cells;

wherein the reference system circuit establishes, as the variable resistance value included therein, first and second resistance values, the first resistance value being established as a reference for the memory cells in the first chip, and the second resistance value being established as a reference for the memory cells in the second chip.

7. The semiconductor device of claim 6:

wherein each of the first and second chips includes a plurality of banks each of which includes the plurality of memory cells.

* * * * *